United States Patent
Shieh

(10) Patent No.: US 10,801,110 B2
(45) Date of Patent: Oct. 13, 2020

(54) GAS INJECTOR FOR SEMICONDUCTOR PROCESSES AND FILM DEPOSITION APPARATUS

(71) Applicant: HERMES-EPITEK CORPORATION, Taipei (TW)

(72) Inventor: Shih-Yung Shieh, Taipei (TW)

(73) Assignee: HERMES-EPITEK CORPORATION, Taipei (TW)

( * ) Notice: Subject to any disclaimer, the term of this patent is extended or adjusted under 35 U.S.C. 154(b) by 260 days.

(21) Appl. No.: 15/590,712

(22) Filed: May 9, 2017

(65) Prior Publication Data
US 2018/0044792 A1    Feb. 15, 2018

(30) Foreign Application Priority Data

Aug. 12, 2016 (TW) .............................. 105125689 A

(51) Int. Cl.
| | | |
|---|---|---|
| C23C 16/40 | (2006.01) | |
| C23C 16/455 | (2006.01) | |
| C23C 16/458 | (2006.01) | |
| C23C 16/22 | (2006.01) | |
| C23C 16/448 | (2006.01) | |
| C23F 1/12 | (2006.01) | |
| H01L 21/02 | (2006.01) | |

(Continued)

(52) U.S. Cl.
CPC ........ *C23C 16/45548* (2013.01); *C23C 16/22* (2013.01); *C23C 16/448* (2013.01); *C23C 16/4584* (2013.01); *C23C 16/45563* (2013.01); *C23C 16/45576* (2013.01); *C23F 1/12* (2013.01); *H01L 21/02312* (2013.01); *H01L 21/306* (2013.01); *F28F 13/003* (2013.01)

(58) Field of Classification Search
CPC ........ C23C 16/45548; C23C 16/45576; C23C 16/45563; C23C 16/4584; C23C 16/22; C23C 16/448; C23F 1/12; H01L 21/02312; H01L 21/306; H01L 21/02104; F28F 13/003
USPC ........................ 118/715; 156/345.33, 345.34
See application file for complete search history.

(56) References Cited

U.S. PATENT DOCUMENTS 8,307,781 B2 * 11/2012 Suzuki .............. C23C 16/45508
118/715
2004/0013801 A1 * 1/2004 Bremser ................ C23C 16/455
427/255.28

(Continued)

FOREIGN PATENT DOCUMENTS

TW          201346065 A     11/2013

OTHER PUBLICATIONS

Office Action dated Oct. 27, 2017, issued in counterpart Taiwanese Patent Application No. 105125689, with Engliosh translation. (9 pages).

*Primary Examiner* — Rudy Zervigon
(74) *Attorney, Agent, or Firm* — Juan Carlos A. Marquez; Marquez IP Law Office, PLLC

(57) ABSTRACT

A gas injector is used in a film deposition apparatus for semiconductor processes. The gas injector comprises a plurality of gas inlets, a plurality of gas flow channels, and a plurality of gas outlets. The gas inlets introduce several kinds of gases into the gas flow channels. The several kinds of gases are delivered to the gas outlets by the gas flow channels. The cross-sectional area of a portion of at least one of the gas flow channels is gradually changed relative to the gas outlets.

15 Claims, 10 Drawing Sheets

(51) Int. Cl.
*H01L 21/306* (2006.01)
*F28F 13/00* (2006.01)

(56) References Cited

U.S. PATENT DOCUMENTS

2008/0308040 A1* 12/2008 Dauelsberg ....... C23C 16/45508
                                                      118/715
2010/0307418 A1* 12/2010 Iso ........................ C23C 16/301
                                                      118/725

* cited by examiner

GAS INJECTOR FOR SEMICONDUCTOR PROCESSES AND FILM DEPOSITION APPARATUS

CROSS-REFERENCE TO RELATED APPLICATION

This application claims priority from Taiwan Patent Application No. 105125689 filed on Aug. 12, 2016, which are hereby incorporated herein by reference in its entirety.

BACKGROUND OF THE INVENTION

1. Field of the Invention

The present invention relates to a vapor phase film deposition apparatus which forms a film on a semiconductor substrate, and particularly, relates to a gas injector for the semiconductor processes implemented by a film deposition apparatus.

2. Description of Related Art

During the formation of a thin film on a semiconductor substrate, the reactor of a film deposition apparatus containing substrates utilizes a gas injector to feed gases, and the gas injector horizontally (or vertically) jets the reaction gasses above a susceptor for mixing. A film is then deposited on each substrate (e.g. a wafer) through physical or chemical reactions induced by heating. The gas injector is designed to horizontally inject the reaction gases and render the reaction gases uniformly distributed on the surface of the rotating substrate so as to form an even boundary layer on the surface of the substrate to facilitate the deposition of thin films. In addition, the spacing and inclined angle of injector outlets also have a critical influence on process result.

FIG. 1 is a schematic cross-sectional diagram which shows the conventional reactor of a film deposition apparatus. A film deposition apparatus comprises a reactor 10 for the growth of a vapor phase deposition film. A closed chamber near vacuum is enclosed by chamber walls 11. A substrate sustaining member (or a substrate holder) 12 is disposed within the chamber, and is used to carry and hold at least one substrate W. An opposing face member 13 is disposed opposing to the substrate sustaining member 12. A gas injector 14 is formed and provided between them, and includes a first injector member 141, a second injector member 142, and gas flow channels 143-145. There are three independent gas flow channels 143-145 sequentially formed between adjacent two of the substrate sustaining member 12, the first injector member 141, the second injector member 142, and the opposing face member 13. In general, the air flow channels 143-145 are respectively used to guide and deliver gases such as a mixture of a source gas of $H_2/N_2/$ group V element, a source gas of a group III element, and carrier gas and a source gas of $H_2/N_2/$group V element for semiconductor processes. The gas injector 14 horizontally jets the reaction gasses above a susceptor for mixing. A film is then deposited on each substrate W through physical or chemical reactions induced by heating.

However, back stream may occur in gas flow from the outlets (the rightest side) of the gas flow channels 143-145 due to turbulence phenomenon. Accordingly, the incompletely reacted gas under a process may remain in the gas injector 14 so that the gas flow channels are contaminated and the growth of succeeding film processes will be affected.

In view of above, the semiconductor manufacture is in very need of a film deposition apparatus capable of settling the foregoing issue of back stream. Therefore, the quality of deposited films is improved.

SUMMARY OF THE INVENTION

The present application provides a gas injector and a film deposition apparatus. The structure of the gas injector is improved to increase the flow rates of process gases so as to avoid the occurrence of back stream.

The present application provides a gas injector and a film deposition apparatus. The cross-sectional area of the outlet side of each gas flow channel is modified to adjust the flow rates of gases leaving from the outlets. That is, the time of chemical reaction between the gas flow and the surface of a substrate through which the flow passes is controllable so as to boost the deposition efficiency of a film.

The present application provides a gas injector and a film deposition apparatus. The structure of the gas injector is improved to increase the flow rates of process gases so as to adjust the rate of chemical reaction between the gases and precursor reactants.

In view of above aspects, the present invention provides an embodiment. A gas injector used in a film deposition apparatus for semiconductor processes comprises: a plurality of gas inlets introducing several kinds of gases; a plurality of gas outlets outward jetting the several kinds of gases; and a plurality of gas flow channels respectively connecting the gas inlets with the gas outlets and delivering the several kinds of gases to the gas outlets; wherein the cross-sectional area of a portion of at least one of the gas flow channels is gradually changed relative to the gas outlets.

In an embodiment, the cross-sectional area of the portion of the at least one of the gas flow channels is gradually increased or decreased relative to the gas outlets.

In another embodiment, the portion of the gas flow channel with a variable cross-sectional area extends to the gas outlet.

In another embodiment, the portion of the gas flow channel with a variable cross-sectional area does not extend to the gas outlet.

In another embodiment, the gas injector further comprises a plurality of inject members separating the gas flow channels from each other. The thickness of at least one of the inject members is gradually increased or decreased to match the portion of the gas flow channel with a variable cross-sectional area.

In another embodiment, one of the gas outlets is an opening at the middle of the gas outlets and others are ring-shaped openings around the opening at the middle. The opening at the middle and the ring-shaped openings are concentric.

The present invention provides another embodiment. A film deposition apparatus for semiconductor processes comprises: a reactor including at least one substrate sustaining member; and a gas injector including a plurality of gas inlets introducing several kinds of gases; a plurality of gas outlets jetting the several kinds of gases toward the substrate sustaining member; and a plurality of gas flow channels respectively connecting the gas inlets with the gas outlets and delivering the several kinds of gases to the corresponding gas outlets; wherein the cross-sectional area of a portion of at least one of the gas flow channels is gradually changed relative to the gas outlet.

In another embodiment, the gas is jetted from the gas outlet along a direction parallel to a surface of the substrate sustaining member.

In another embodiment, the gas is jetted from the gas outlet along a direction perpendicular to a surface of the substrate sustaining member.

The present invention provides another embodiment. A film deposition apparatus for semiconductor processes comprises: a reactor including a susceptor and an opposing face member opposing to the susceptor; and a gas injector including a plurality of inject members disposed between the susceptor and the opposing face member, and a plurality of gas flow channels formed by separating space between the susceptor and the opposing face member with the inject members into individual gas delivery paths; wherein the cross-sectional area of a portion of at least one of the gas flow channels is gradually changed relative to the gas outlet.

BRIEF DESCRIPTION OF THE DRAWINGS

In order to sufficiently understand the essence, advantages and the preferred embodiments of the present invention, the following detailed description will be more clearly understood by referring to the accompanying drawings.

DETAILED DESCRIPTION OF THE INVENTION

The following description shows the preferred embodiments of the present invention. The present invention is described below by referring to the embodiments and the figures. Thus, the present invention is not intended to be limited to the embodiments shown, but is to be accorded the principles disclosed herein. Furthermore, that various modifications or changes in light thereof will be suggested to persons skilled in the art and are to be included within the spirit and purview of this application and scope of the appended claims.

Figure 1:
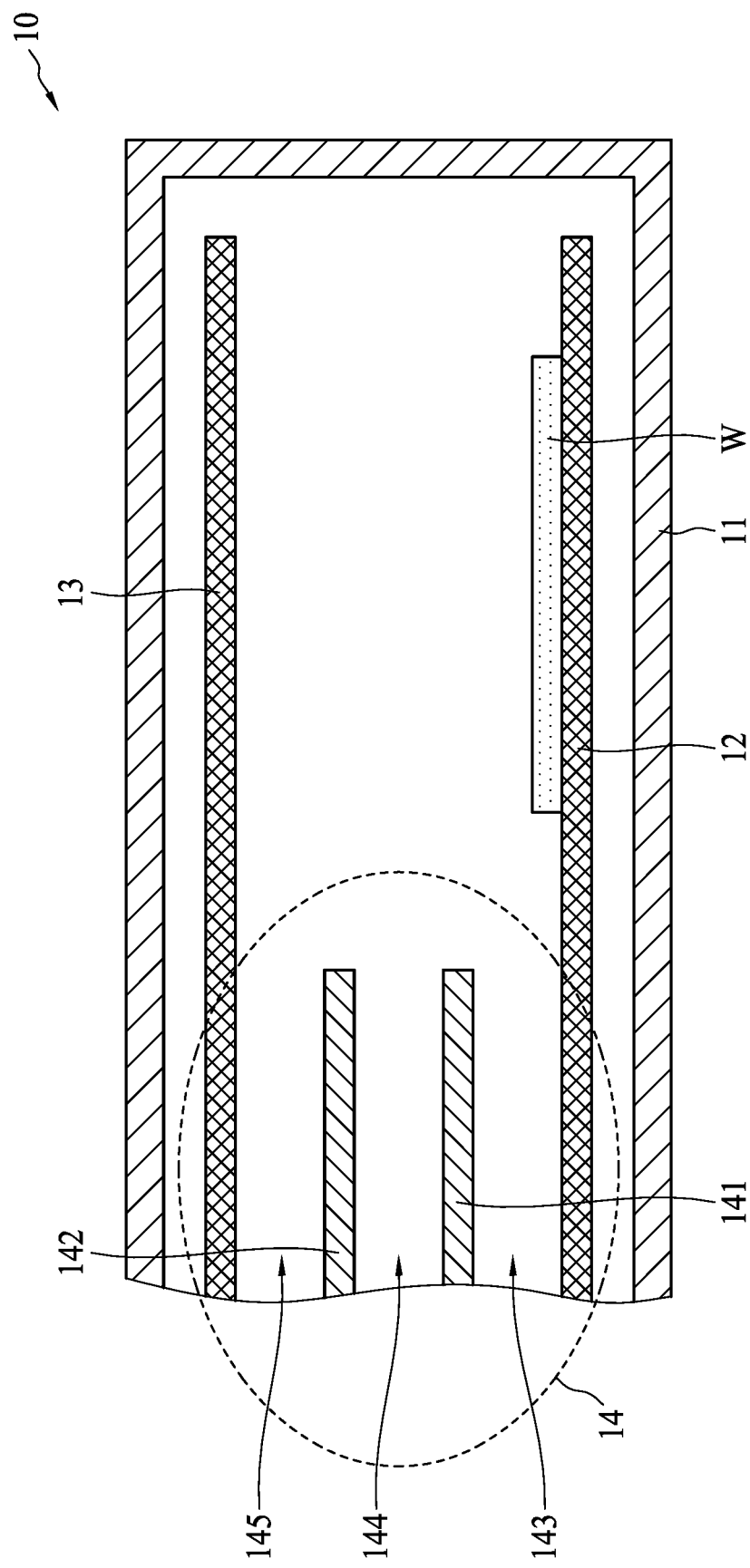
FIG. 1 is a schematic cross-sectional diagram which shows the conventional reactor of a film deposition apparatus.
Figure 2:
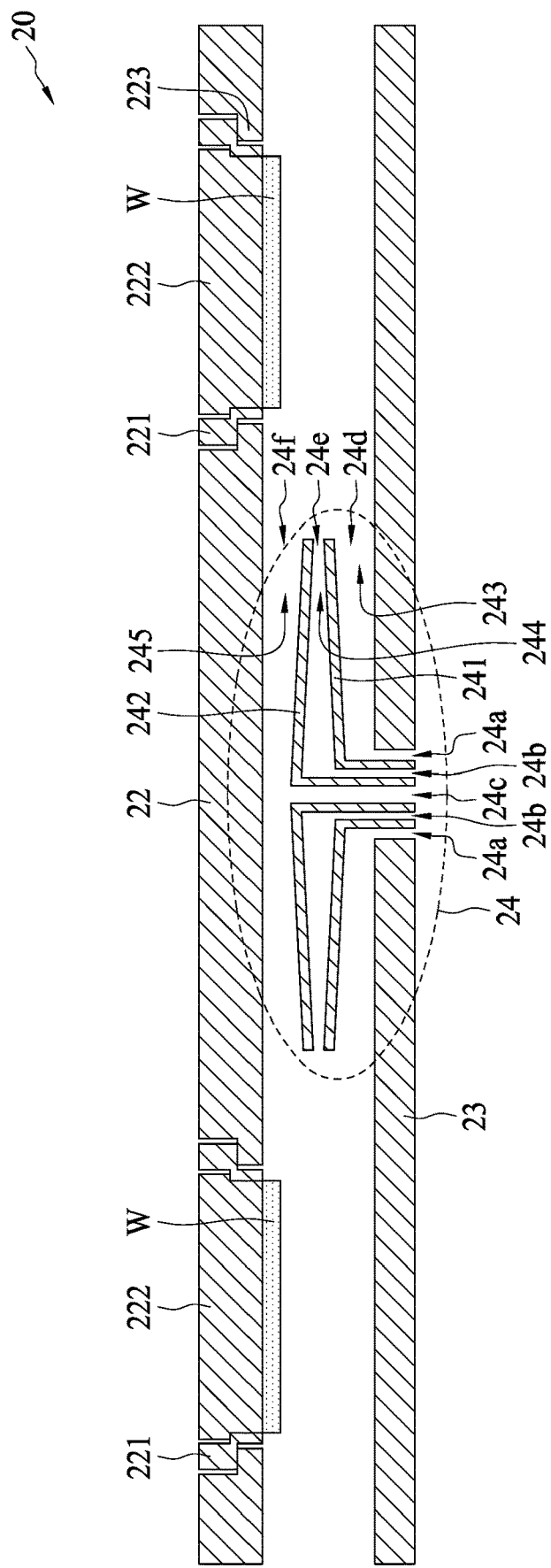
FIG. 2 is a schematic cross-sectional diagram which shows the reactor of a film deposition apparatus in accordance with an embodiment of the present invention.

FIG. 2 is a schematic cross-sectional diagram which shows the reactor of a film deposition apparatus in accordance with an embodiment of the present invention. As shown in this figure, the reactor 20 is an example showing a film deposition apparatus for the growth of group III-V compound semiconductor. The reactor 20 comprises a susceptor 22, an opposing face member 23 is disposed opposing to the susceptor 22, a gas injector 24, and a gas exhaust portion 25. Substrates W are carried by a substrate sustaining member (or a substrate holder) 221, and theirs rears (i.e. a surface without circuits) are heated by isothermal plates 222. The substrate sustaining member 221 is disposed on the supporting member 223 of the susceptor 22. In this embodiment, the reactor 20 forms a thin film simultaneously on each of the substrates W. By contrast, it also can conduct a deposition process just for a single substrate W. As shown in this figure, regarding this embodiment, the surface (with circuits) of the substrate W faces downward in a perpendicular direction (so-called face down type apparatus). Under ordinary film deposition conditions, gravitational influences are slight. In other embodiments, the same surface of the substrate W faces upward (so-called face up apparatus). Thus, it is self-evident that the effects of the present application can be obtained also in a so-called face up apparatus in which the surface of substrate faces upward. Therefore, the present application shall not be limited to a face down type apparatus.

In this embodiment, the reactor 20 is centrosymmetric and structured so that the susceptor 22 revolves around its central axis and the substrate W rotates by itself at the same time. A configuration or mechanism for the revolution and rotation as described above does not limit the present application. The gas injector 24 is composed of a first injector member 241 and a second injector member 242, and the upper, middle and lower gas flow channels 243-245 are dividedly formed between them. For most of cases, a source gas of $H_2/N_2$/group V element is introduced from the upper gas flow channel 243, a source gas of a group III element and a carrier gas are introduced from the middle gas flow channel 244, and a source gas of $H_2/N_2$/group V is introduced from the lower gas flow channel 245. The gas flow channels 243-245 may deliver source gases of a group III and V element in various ways. Therefore, the application shall not be limited to the embodiment. The upper, middle and lower gas flow channels 243-245 may be arranged in a different manner. For example, they respectively deliver source gases of group V/III/V. The carrier gas may be $H_2$, $N_2$, $H_2+N_2$, $NH_3$ (group V), $H_2+NH_3$ (group V) or the mixture of at least two of the foregoing gases.

The gas injector 24 includes a plurality of gas inlets 24a-24c, a plurality of gas flow channels 243-245, and a plurality of gas outlets 24d-24f. The gas inlets 24a-24c introduce various gases, and respectively deliver the gases toward corresponding each of the gas outlets 24d-24f. The gas outlets 24d-24f of the gas injector 24 jets the reaction gasses above the substrates W for mixing. A film is then deposited on each substrate W through physical or chemical reactions induced by heating. In this embodiment, the distance between the first injector member 241 and the second injector member 242 are gradually decreased toward the gas outlets 24d-24f. That is, the cross-sectional area of the middle gas flow channel 244 is gradually decreased, and those of the upper and lower gas flow channels 243 and 245 are gradually increased. In this regard, the cross-sectional area represents that the area of a hollow portion within each gas flow channel which allows gases to pass. Thus, the gas outlet 24e of the middle gas flow channel 244 can increase the flow rate of delivered gases for jetting out them so that the forgoing problem of back stream may be resolved. In this embodiment, the modified cross-sectional areas of the gas flow channels are described by a current example. If at least one of the gas flow channels has a lengthwise portion with a variable cross-sectional area which is gradually changed relative to the gas outlets 24d-24f, such embodiments are also included in the protection scope of the present application. Further, the number and configuration of the gas flow channels may be different from the disclosure of the embodiment.

In the present embodiment, the cross-sectional area of each of the gas flow channels 243-245 is modified to adjust the flow rate of gases leaving from the outlets. That is, the time of chemical reaction between gas flow and the surface of a substrate W through which the flow passes is changeable so as to boost the deposition efficiency of a film.

Figure 3:
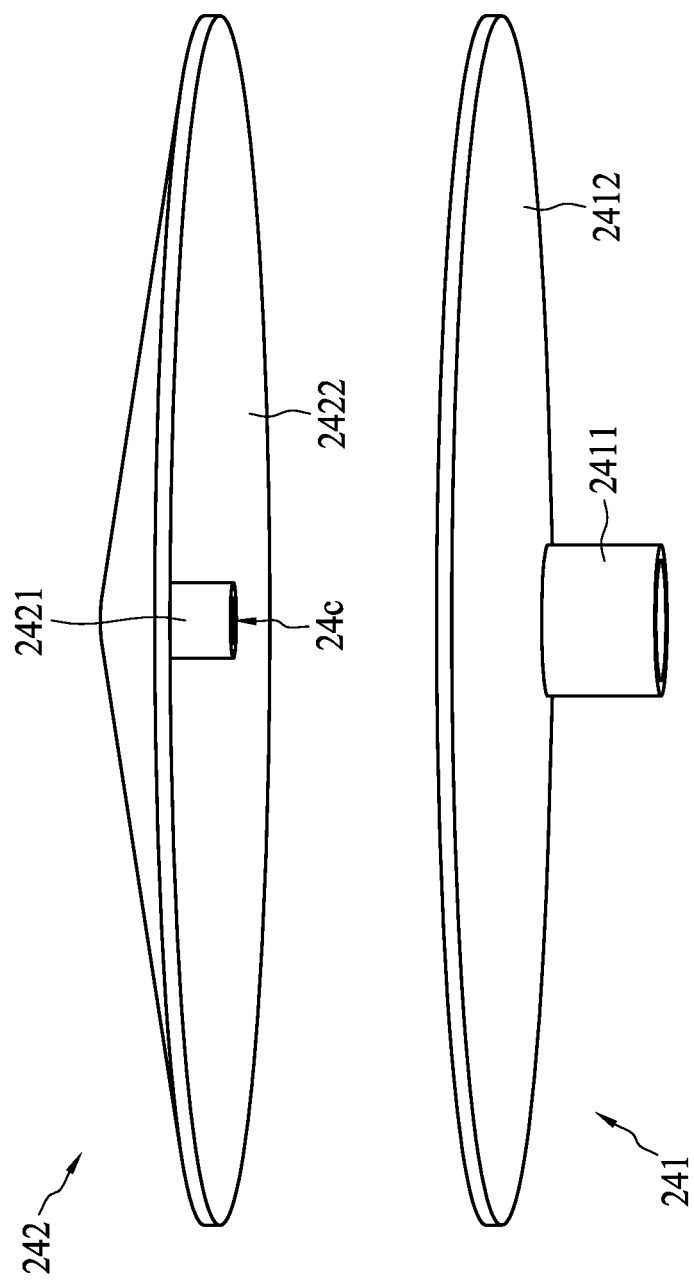
FIG. 3 is an exploded perspective view which shows the inject members of the gas injector as shown in FIG. 2.

As shown in FIG. 3, this figure clearly illustrates the three dimensional structures and relative locations of the first injector member 241 and the second injector member 242. The first injector member 241 is placed below the second injector member 242, and both are disk-like. There are a first introduction portion 2411 disposed at the middle of the first injector member 241 and a second introduction portion 2421 disposed at the middle of the second injector member 242. Referring to FIG. 2, when the first injector member 241 and the second injector member 242 are assembled together, the first introduction portion 2411 surrounds the second introduction portion 2421. The gap between the both ends of the second introduction portion 2421 and the first introduction portion 2411 is the gas inlet 24b. The gap between the first introduction portion 2411 and the opposing face member 23 is the gas inlet 24a. The opening of the end side of the second introduction portion 2421 is the gas inlet 24c. The angle included between the first injector member 241 and the first introduction portion 2411 is obtuse, and the angle included between the second injector member 242 and the second introduction portion 2421 is acute. The two included angles both are not right angles so that the cross-sectional area of each of the air flow channels 243-245 is gradually changed along a lengthwise direction.

Figure 4:
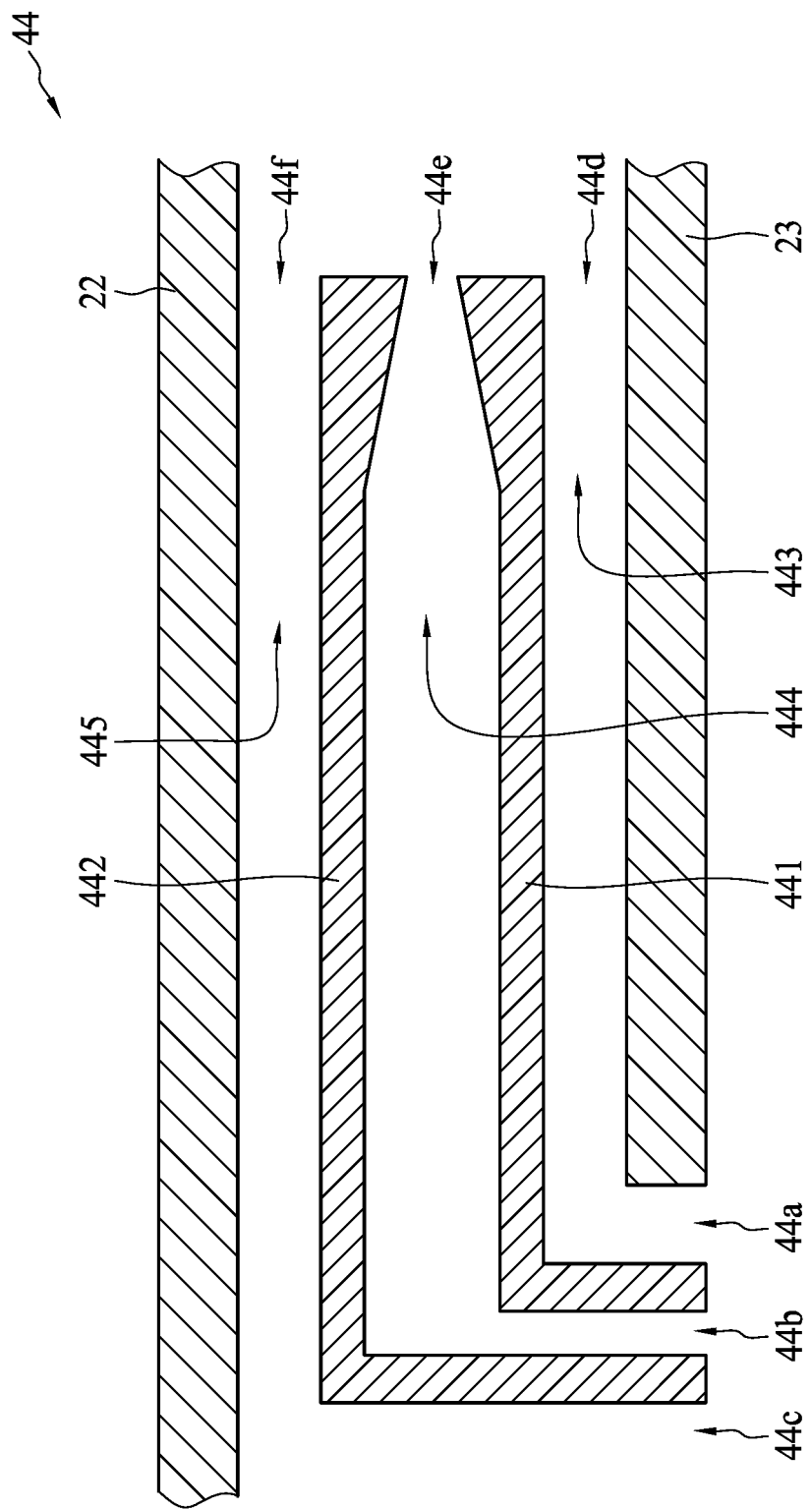
FIG. 4 is a schematic cross-sectional diagram which shows a gas injector in accordance with another embodiment of the present invention.

FIG. 4 is a schematic cross-sectional diagram which shows a gas injector in accordance with another embodiment of the present invention. The gas injector 44 is composed of a first injector member 441 and a second injector member 442, and comprises a plurality of gas inlets 44a-44c, a plurality of gas flow channels 443-445, and a plurality of gas outlets 44d-44f. The thickness of each of the first injector member 441 and the second injector member 442 is not uniform, and is gradually increased within a segment closed to the gas outlet 44e. In another embodiment, the thickness of the whole member may be gradually increased. Thus, in this embodiment, the cross-sectional area of a downstream portion of the middle gas flow channel 444 is gradually increased toward the gas outlet 44e. The cross-sectional area of each of the upper gas flow channel 443 and the lower gas flow channel 445 is substantially unchanged.

Figure 5:
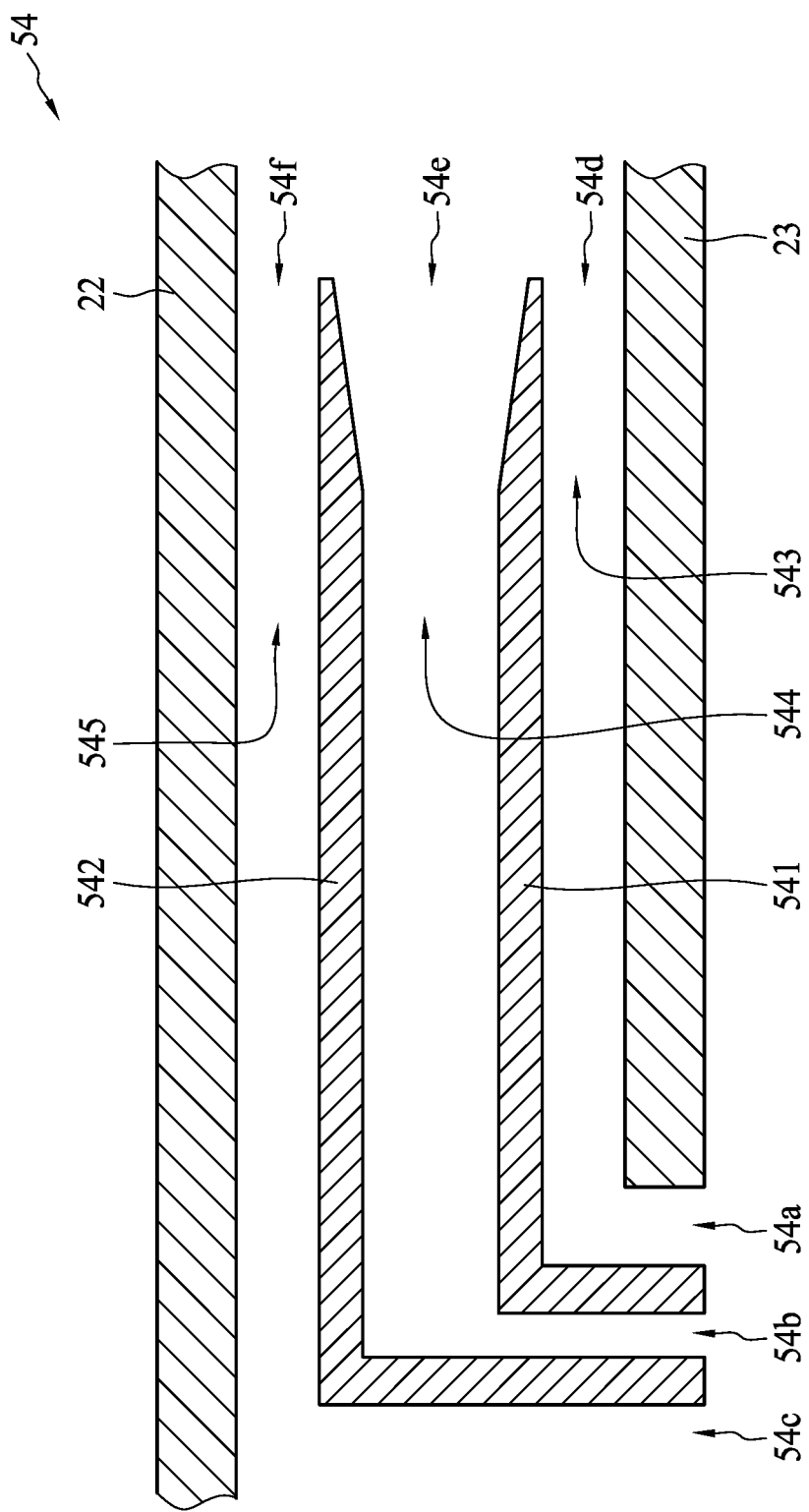
FIG. 5 is a schematic cross-sectional diagram which shows a gas injector in accordance with yet another embodiment of the present invention.

Compared with FIG. 4, FIG. 5 is a schematic cross-sectional diagram which shows a gas injector in accordance with yet another embodiment of the present invention. The gas injector 54 is composed of a first injector member 541 and a second injector member 442, and comprises a plurality of gas inlets 54a-54c, a plurality of gas flow channels 543-545, and a plurality of gas outlets 54d-54f. The thickness of each of the first injector member 541 and the second injector member 542 is not uniform, and is gradually decreased within a segment closed to the gas outlet 54e. In another embodiment, the thickness of the whole member may be gradually decreased. Thus, in this embodiment, the cross-sectional area of a downstream portion of the middle gas flow channel 544 is gradually increased toward the gas outlet 54e. The cross-sectional area of each of the upper gas flow channel 543 and the lower gas flow channel 545 is substantially unchanged.

Figure 6:
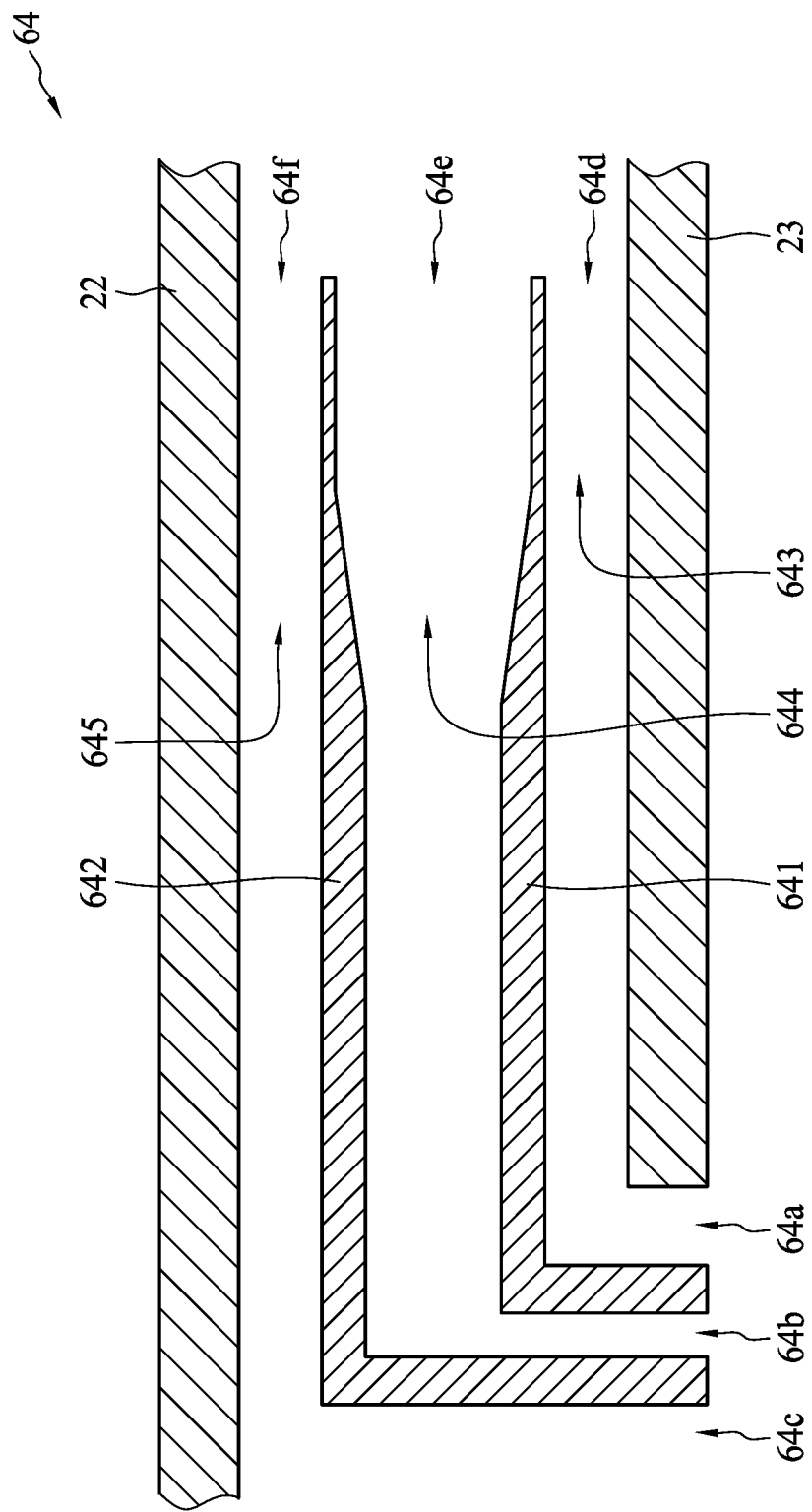
FIG. 6 is a schematic cross-sectional diagram which shows a gas injector in accordance with another embodiment of the present invention.

FIG. 6 is a schematic cross-sectional diagram which shows a gas injector in accordance with another embodiment of the present invention. The gas injector 64 is composed of a first injector member 641 and a second injector member 642, and comprises a plurality of gas inlets 64a-64c, a plurality of gas flow channels 643-645, and a plurality of gas outlets 64d-64f. The thickness of each of the first injector member 641 and the second injector member 642 is not uniform. It is gradually decreased within a segment closed to the gas outlet 64e, but the end segment is substantially unchanged. That is, the gradually changed segment does not reach the gas outlet 64e. Thus, in this embodiment, the cross-sectional area of a downstream portion of the middle gas flow channel 644 is gradually increased toward the gas outlet 64e. The cross-sectional area of each of the upper gas flow channel 643 and the lower gas flow channel 645 is substantially unchanged.

In view of the several embodiments, the cross-sectional area of one of the air flow channels is modified within a segment closed to the gas outlet to adjust the flow rate of gas leaving from the outlet. That is, the time of chemical reaction between gas flow and the surface of a substrate W through which the flow passes is changeable so as to boost the deposition efficiency of a film.

Figure 7:
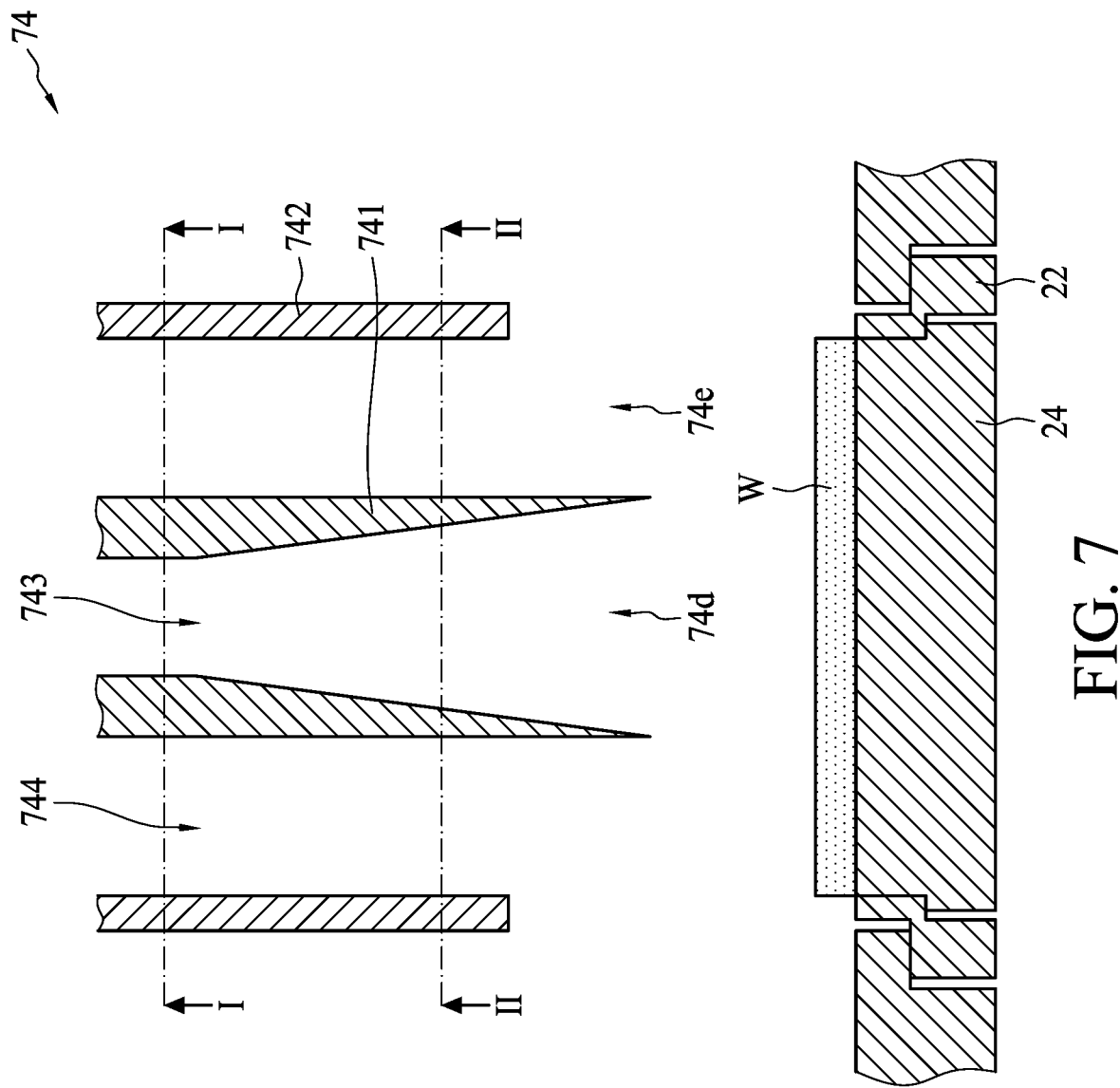
FIG. 7 is a schematic cross-sectional diagram which shows a gas injector in accordance with another embodiment of the present invention.

As described so far, the direction of jetting gases from the gas outlets is substantially parallel to the surface of the wafer. However, the direction of jetting gases from the gas outlets perpendicular to the surface of the wafer is also included within the purview of this application. FIG. 7 is a schematic cross-sectional diagram which shows a gas injector in accordance with another embodiment of the present invention. The gas injector 74 is composed of a first injector member 741 and a second injector member 742, and comprises a plurality of gas inlets 74a-74c, a plurality of gas flow channels 743-744, and a plurality of gas outlets 74d-74f. The thickness of the first injector member 741 is not uniform, and is gradually decreased within a segment closed to the gas outlet 74d. The segment with a gradually varied thickness reaches the gas outlet 74d. Thus, in this embodiment, the cross-sectional area of a downstream portion of the middle gas flow channel 743 is gradually increased toward the gas outlet 74d. The cross-sectional area of the outer gas flow channel 744 is substantially unchanged.

Figure 8A:
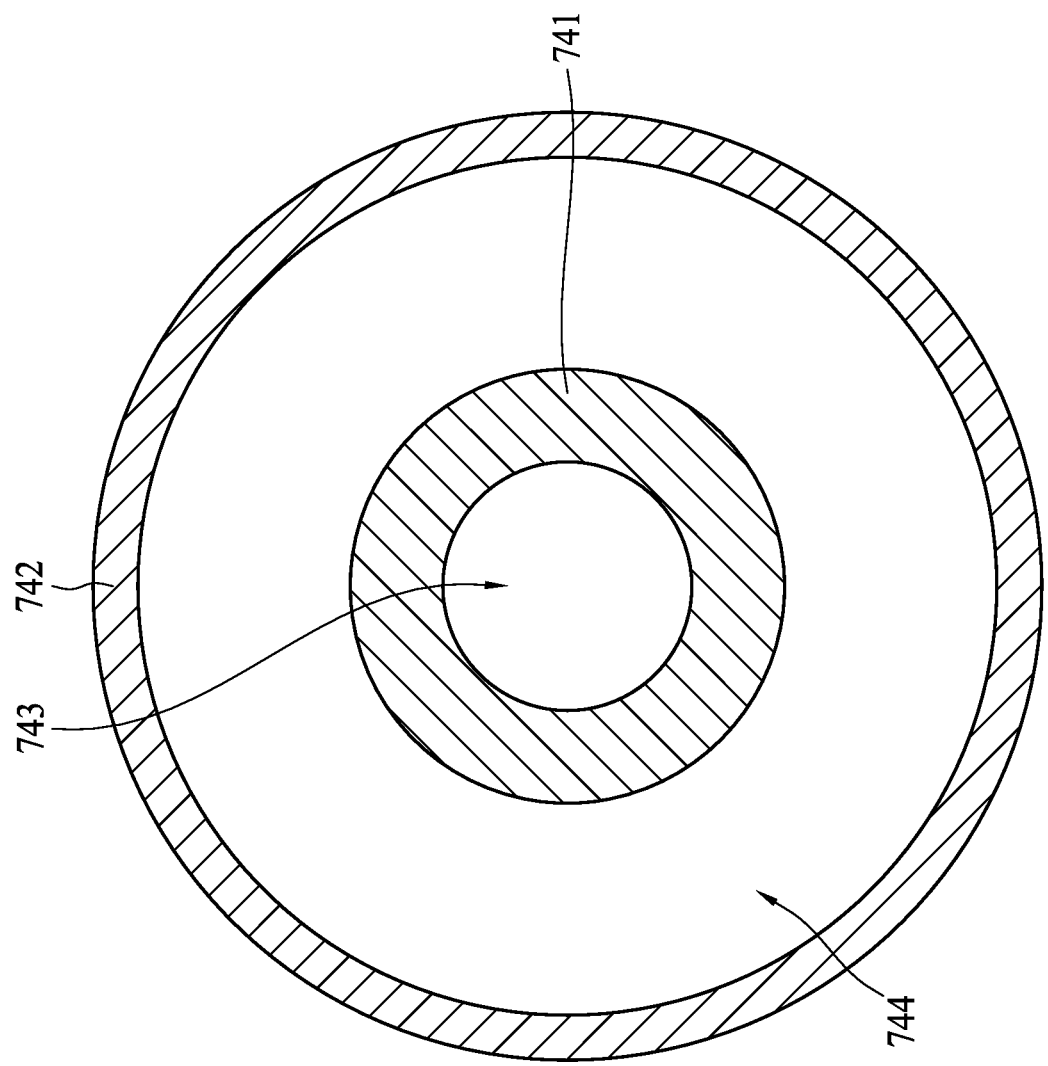
FIG. 8A is a schematic cross-sectional diagram taken along the line of I-I in FIG. 7.
Figure 8B:
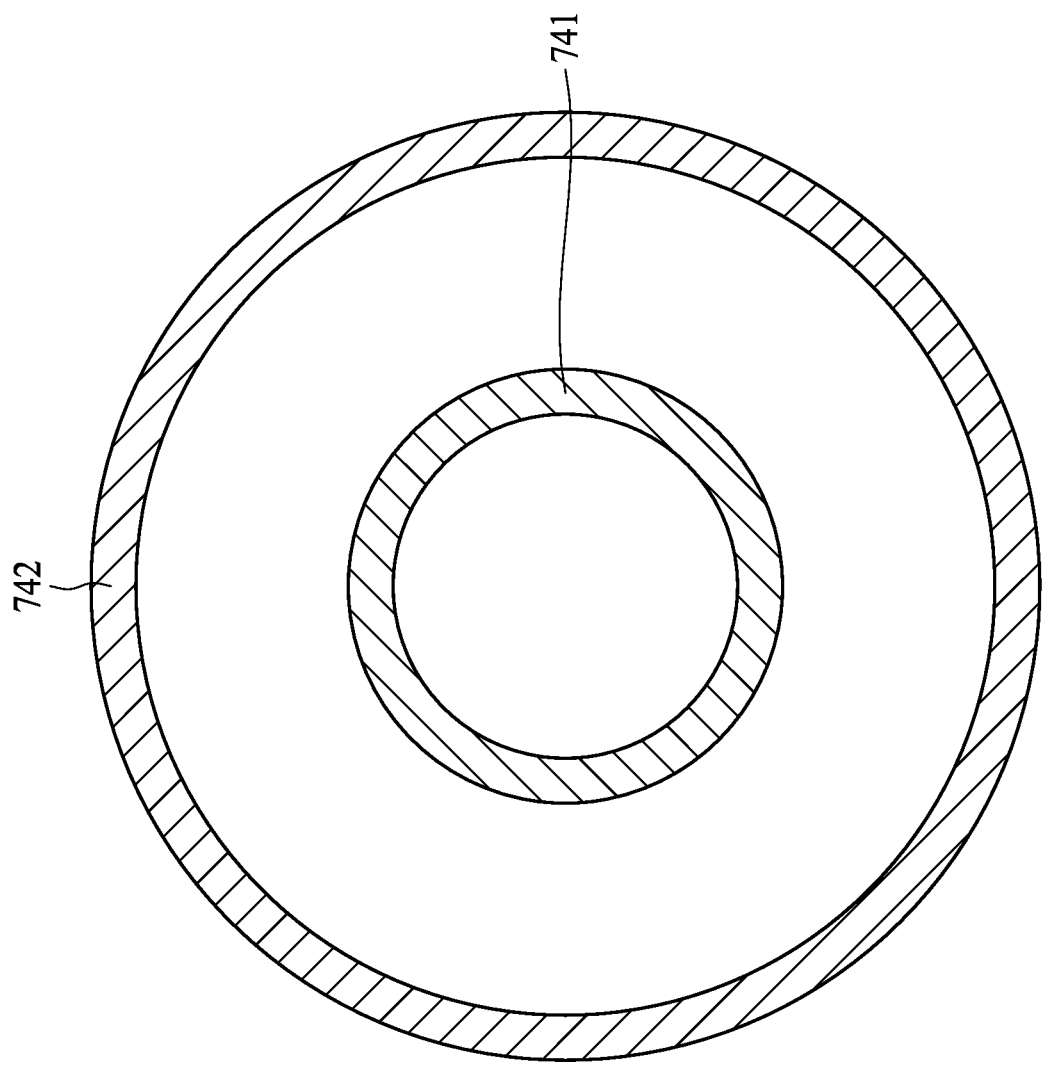
FIG. 8B is a schematic cross-sectional diagram taken along the line of II-II in FIG. 7.

FIG. 8A is a schematic cross-sectional diagram taken along the line of I-I in FIG. 7, and FIG. 8B is a schematic cross-sectional diagram taken along the line of II-II in FIG. 7. As shown in FIG. 8A, the first injector member 741 and a second injector member 742 are two concentric tubes (or tubular bodies). The gap between them is the outer gas flow channel 744, and the hollow of the first injector member 741 is the middle gas flow channel 743. Referring to the two cross-sectional diagrams, it is obvious to understand the variation in the thickness of the first injector member 741.

Figure 9:
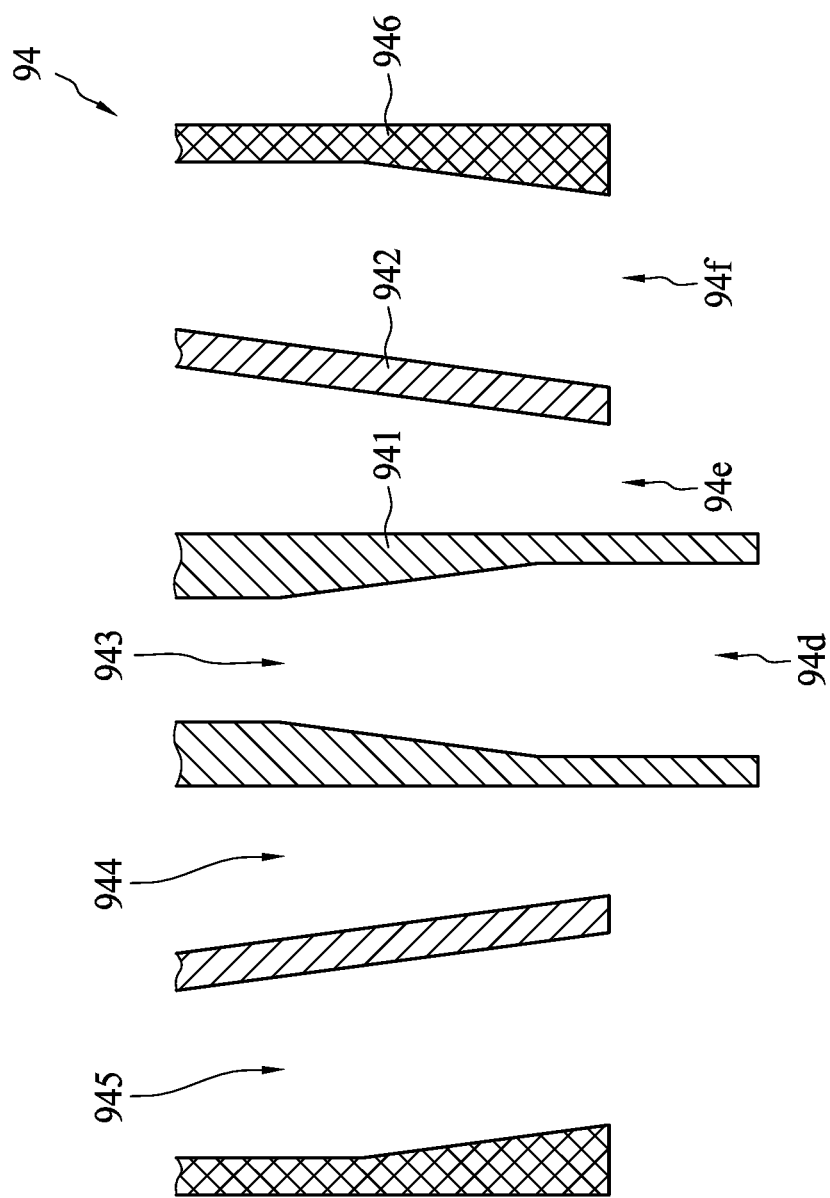
FIG. 9 is a schematic cross-sectional diagram which shows a gas injector in accordance with another embodiment of the present invention.

As to the embodiment, the gas injector with two gas flow channels is illustrated. However, the number of the gas flow channels is not limited to the present application. That is, plural or at least two gas flow channels are included within the purview of this application. FIG. 9 is a schematic cross-sectional diagram which shows a gas injector in accordance with another embodiment of the present invention. The gas injector 94 is composed of a first injector member 941, a second injector member 942, and a third injector member 946, and comprises a plurality of gas flow channels 943-945 and a plurality of gas outlets 94d-94f. The thickness of the first injector member 941 is not uniform. It is gradually decreased within a segment closed to the gas outlet 94d, but the end segment is substantially unchanged. That is, the gradually changed segment does not reach the gas outlet 94d. Thus, in this embodiment, the thickness of the second injector member 942 is substantially constant, and its wall is tapered or inward slanted toward the gas outlet 94e. Furthermore, the third injector member 946 is not even, and is gradually increased within a segment closed to the gas outlet 94f. The segment with a gradually varied thickness reaches the gas outlet 94f. Accordingly, the cross-sectional area of a portion of the gas flow channel 943 is gradually increased toward the gas outlet 94d, the cross-sectional area of the gas flow channel 944 is gradually increased toward the gas outlet 94e, and the cross-sectional area of the outer gas flow channel 945 is decreased in a two-step manner. The cross-sectional areas of the gas flow channels 943-945 in the embodiment are all varied. However, the cross-sectional areas or the number among the gas flow channels may be optionally varied based on the requirement and condition of a deposition process.

The vertical-type gas injector of the present application may be further completed and modified by arbitrarily combining the various modes of a changeable cross-sectional area for each of the gas flow channels. The present application is not limited to the above embodiments. The cross-sectional area of one of the air flow channels is modified within a segment closed to the gas outlet to adjust the flow rate of gas leaving from the outlet. That is, the time of chemical reaction between gas flow and the surface of a substrate W through which the flow passes is changeable so as to improve the deposition efficiency of a film.

The foregoing embodiments of the invention have been presented for the purpose of illustration. Although the invention has been described by certain preceding examples, it is not to be construed as being limited by them. They are not intended to be exhaustive, or to limit the scope of the invention. Modifications, improvements and variations within the scope of the invention are possible in light of this disclosure.

What is claimed is:

1. A gas injector used in a film deposition apparatus for semiconductor processes comprising:
    a plurality of gas inlets introducing several kinds of gases;
    a plurality of gas outlets outward jetting the several kinds of gases; and
    a plurality of gas flow channels respectively connecting the gas inlets with the gas outlets and delivering the several kinds of gases to the corresponding gas outlets;
    wherein the cross-sectional area of a portion of at least one of the gas flow channels is gradually decreased toward the gas outlet along a downstream direction of the gases;
    wherein one of the gas outlets is an opening at the middle of the gas outlets and others are ring-shaped openings around the opening at the middle.

2. The gas injector used in a film deposition apparatus for semiconductor processes according to claim 1, wherein the portion of the gas flow channel with a variable cross-sectional area extends to the gas outlet.

3. The gas injector used in a film deposition apparatus for semiconductor processes according to claim 1, wherein a portion of the gas flow channel reaching the gas outlet has a uniform cross-sectional area.

4. The gas injector used in a film deposition apparatus for semiconductor processes according to claim 1, wherein the gas injector further comprises a plurality of injector members separating the gas flow channels from each other, and wherein the thickness of at least one of the injector members is gradually increased for matching the portion of the gas flow channel with a variable cross-sectional area.

5. The gas injector used in a film deposition apparatus for semiconductor processes according to claim 1, wherein the opening at the middle and the ring-shaped openings are concentric.

6. The gas injector used in a film deposition apparatus for semiconductor processes according to claim 1, wherein a flow rate of the gases leaving from the gas outlet is adjusted due to the cross-sectional area gradually decreased toward the gas outlet so that the time of chemical reaction for the gases is adjustable.

7. The gas injector used in a film deposition apparatus for semiconductor processes according to claim 1, wherein the several kinds of gases include a mixture of a group III element and carrier gases and a mixture of source gases of $H_2/N_2$/group V element.

8. A film deposition apparatus for semiconductor processes comprising:
    a reactor including at least one substrate sustaining member; and
    a gas injector including:
        a plurality of gas inlets introducing several kinds of gases;
        a plurality of gas outlets jetting the several kinds of gases toward the substrate sustaining member; and
        a plurality of gas flow channels respectively connecting the gas inlets with the gas outlets and delivering the several kinds of gases to the corresponding gas outlets;
    wherein the cross-sectional area of a portion of at least one of the gas flow channels is gradually decreased toward the gas outlet along a downstream direction of the gases;
    wherein one of the gas outlets is an opening at the middle of the gas outlets and others are ring-shaped openings around the opening at the middle.

9. The film deposition apparatus for semiconductor processes according to claim 8, wherein the portion of the gas flow channel with a variable cross-sectional area extends to the gas outlet.

10. The film deposition apparatus for semiconductor processes according to claim 8, wherein a portion of the gas flow channel reaching the gas outlet has a uniform cross-sectional area.

11. The film deposition apparatus for semiconductor processes according to claim 8, wherein the gas injector further comprises a plurality of injector members separating the gas flow channels from each other, and wherein the thickness of the at least one of the injector members is gradually increased for matching the portion of the gas flow channel with a variable cross-sectional area.

12. The film deposition apparatus for semiconductor processes according to claim 8, wherein a direction of jetting gases from the gas outlets is substantially perpendicular to the surface of the substrate sustaining member.

13. The film deposition apparatus for semiconductor processes according to claim 8, wherein the opening at the middle and the ring-shaped openings are concentric.

14. The film deposition apparatus for semiconductor processes according to claim 8, wherein a flow rate of the gases leaving from the gas outlet is adjusted due to the cross-sectional area gradually decreased toward the gas outlet so that the time of chemical reaction for the gases is adjustable.

15. The film deposition apparatus for semiconductor processes according to claim 8, wherein the several kinds of gases include a mixture of a group III element and carrier gases and a mixture of source gases of $H_2/N_2$/group V element.

* * * * *